(12) United States Patent
Zhu et al.

(10) Patent No.: US 12,315,736 B2
(45) Date of Patent: May 27, 2025

(54) METHODS OF HIGHLY SELECTIVE SILICON OXIDE REMOVAL

(71) Applicant: Applied Materials, Inc., Santa Clara, CA (US)

(72) Inventors: Lala Zhu, Fremont, CA (US); Shi Che, Sunnyvale, CA (US); Dongqing Yang, Pleasanton, CA (US); Nitin K. Ingle, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 206 days.

(21) Appl. No.: 17/944,540

(22) Filed: Sep. 14, 2022

(65) Prior Publication Data

US 2024/0087910 A1 Mar. 14, 2024

(51) Int. Cl.
*H01L 21/311* (2006.01)
*H01L 21/02* (2006.01)
*H01L 21/324* (2006.01)

(52) U.S. Cl.
CPC .. *H01L 21/31116* (2013.01); *H01L 21/02164* (2013.01); *H01L 21/0217* (2013.01); *H01L 21/02532* (2013.01); *H01L 21/02595* (2013.01); *H01L 21/324* (2013.01)

(58) Field of Classification Search
None
See application file for complete search history.

(56) References Cited

U.S. PATENT DOCUMENTS

| | | | |
|---|---|---|---|
| 8,187,486 B1 | 5/2012 | Liu et al. | |
| 8,647,992 B2 | 2/2014 | Liang et al. | |
| 9,564,341 B1* | 2/2017 | Xu | H01L 21/31116 |
| 2009/0275205 A1 | 11/2009 | Kiehlbauch et al. | |
| 2012/0295420 A1* | 11/2012 | Pal | H01L 29/66651 |
| | | | 438/585 |
| 2021/0375688 A1* | 12/2021 | Shen | H01L 29/78696 |

FOREIGN PATENT DOCUMENTS

| KR | 20140083006 A | 7/2014 |
|---|---|---|
| KR | 20200088218 A | 7/2020 |

OTHER PUBLICATIONS

Application No. PCT/US2022/045931, International Search Report and Written Opinion, Mailed on Jun. 8, 2023, 9 pages.

* cited by examiner

*Primary Examiner* — Shamim Ahmed
(74) *Attorney, Agent, or Firm* — Kilpatrick Townsend & Stockton LLP

(57) ABSTRACT

A semiconductor processing method may include providing a fluorine-containing precursor to a processing region of a semiconductor processing chamber. A substrate may be disposed within the processing region. The substrate may include an exposed region of silicon-and-oxygen-containing material. The substrate may include an exposed region of a liner material. The methods may include providing a hydrogen-containing precursor to the semiconductor processing region. The methods may include contacting the substrate with the fluorine-containing precursor and the hydrogen-containing precursor. The methods may include selectively removing at least a portion of the exposed silicon-and-oxygen-containing material.

20 Claims, 6 Drawing Sheets

METHODS OF HIGHLY SELECTIVE SILICON OXIDE REMOVAL

TECHNICAL FIELD

The present technology relates to semiconductor systems, processes, and equipment. More specifically, the present technology relates to systems and methods for selectively etching material layers on a semiconductor device.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials. Deposition processes, however, continue to be performed across substrates generally utilizing a blanket coat or a conformal fill.

As device sizes continue to shrink in next-generation devices, selectivity may play a larger role when only a few nanometers of material are formed in a particular layer, especially when the material is critical in the transistor formation. Many different etch process selectivities have been developed between various materials, although standard selectivities may no longer be suitable at current and future device scale. Additionally, queue times for processes continue to rise based on the number of masking, formation, and removal operations needed to form and protect the various critical dimensions of features across a device while patterning and formation are performed elsewhere on a substrate.

Thus, there is a need for improved systems and methods that can be used to produce high quality devices and structures. These and other needs are addressed by the present technology.

SUMMARY

Exemplary semiconductor processing methods may include providing a fluorine-containing precursor to a processing region of a semiconductor processing chamber. A substrate may be disposed within the processing region. The substrate may include an exposed region of silicon-and-oxygen-containing material. The substrate may include an exposed region of a liner material. The methods may include providing a hydrogen-containing precursor to the semiconductor processing region. The methods may include contacting the substrate with the fluorine-containing precursor and the hydrogen-containing precursor. The methods may include selectively removing at least a portion of the exposed silicon-and-oxygen-containing material.

In some embodiments, the fluorine-containing precursor may be or include hydrogen fluoride. The hydrogen-containing precursor may be or include ammonia. The exposed region of silicon-and-oxygen-containing material may be an oxidized surface of the substrate. The exposed region of the liner material may be a low dielectric constant spacer material. A temperature within the semiconductor processing chamber may be maintained at less than or about 200° C. A pressure within the semiconductor processing chamber may be maintained at less than or about 20 Torr. The methods may include performing a thermal anneal subsequent to contacting the substrate with the fluorine-containing precursor and the hydrogen-containing precursor. The thermal anneal selectively may remove the portion of the exposed region of silicon-and-oxygen-containing material through sublimation.

Some embodiments of the present technology encompass semiconductor processing methods. The methods may include i) providing a fluorine-containing precursor and a hydrogen-containing precursor to a processing region of a semiconductor processing chamber. A substrate including an exposed region of silicon-and-oxygen-containing material may be disposed within the processing region. The methods may include ii) contacting the exposed region of silicon-and-oxygen-containing material with the fluorine-containing precursor and the hydrogen-containing precursor. The methods may include iii) forming a silicon-and-oxygen-containing byproduct on the substrate. The methods may include iv) annealing the substrate. The annealing may sublimate at least a portion of the silicon-and-oxygen-containing byproduct.

In some embodiments, operations i) through iv) may be a cycle. The semiconductor processing method may include at least two cycles. Each cycle may be performed for less than or about 200 seconds. The portion of the silicon-and-oxygen-containing byproduct may be removed at a selectivity of greater than or about 3:1 relative to an exposed region of a liner material. A flow rate of the fluorine-containing precursor may be less than or about 500 sccm. A flow rate of the hydrogen-containing precursor may be less than or about 100 sccm.

Some embodiments of the present technology encompass semiconductor processing methods. The methods may include providing a fluorine-containing precursor to a processing region of a semiconductor processing chamber. A substrate is disposed within the processing region. The substrate may include an exposed region of silicon-and-oxygen-containing material. The substrate may include an exposed region of a liner material. The methods may include providing a hydrogen-containing precursor to the semiconductor processing region. The methods may include contacting the substrate with the fluorine-containing precursor and the hydrogen-containing precursor. The methods may include annealing the substrate. Annealing the substrate may sublimate at least a portion of the exposed region of silicon-and-oxygen-containing material relative to the exposed region of the liner material.

In some embodiments, annealing the substrate may include positioning the substrate closer to a showerhead of the semiconductor processing chamber. A selectivity between the exposed region of silicon-and-oxygen-containing material relative to the exposed region of the liner material may be greater than or about 3:1. A flow rate ratio of the fluorine-containing precursor relative to the hydrogen-containing precursor may be less than or about 10:1. A removal rate of the exposed region of silicon-and-oxygen-containing material may be greater than or about 0.3 Å/second. The processing region may be maintained plasma-free during the semiconductor processing method.

The technology described herein may provide numerous benefits over conventional systems and techniques. For example, the technology described herein may allow removal to be performed that may protect other features or materials on the substrate. Additionally, the processes may selectively remove silicon-and-oxygen materials relative to other exposed materials on the substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
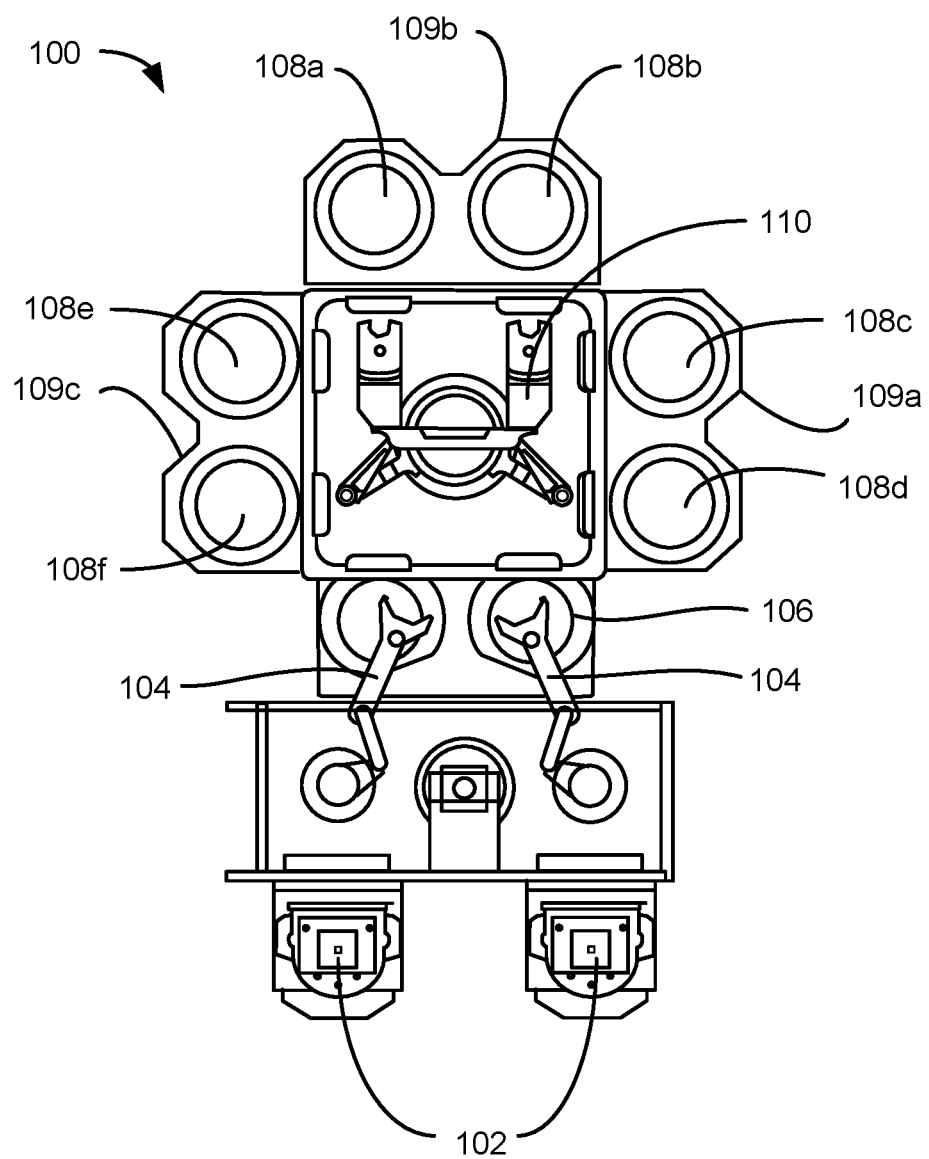
FIG. 1 shows a top plan view of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Dilute acids may be used in many different semiconductor processes for cleaning substrates and removing materials from those substrates. For example, diluted hydrofluoric acid can be an effective etchant for silicon oxide and other materials, and may be used to remove these materials from substrate surfaces. After the etching or cleaning operation is complete, the acid may be dried from the wafer or substrate surface. Using dilute hydrofluoric acid ("DHF") may be termed a "wet" etch, and the diluent is often water. Additional etching processes may be used that utilize precursors delivered to the substrate. For example, plasma enhanced processes may also selectively etch materials by enhancing precursors through the plasma to perform a dry etch, including a reactive ion etching.

Although wet etchants using aqueous solutions or water-based processes may operate effectively for certain substrate structures, these processes may not selectively remove silicon oxide and other materials from substrate surfaces. For example, utilizing water during etch processes may cause issues when disposed on substrates including metal materials. For example, certain later fabrication processes, such as recessing gaps, removing oxide dielectric, or other processes to remove oxygen-containing materials, may be performed after an amount of metallization has been formed on a substrate. If water is utilized in some fashion during the etching, an electrolyte may be produced, which when contacting the metal material, may cause galvanic corrosion to occur between dissimilar metals, and the metal may be corroded or displaced in various processes. Additionally, conventional technologies using dilute acids may suffer from selectivity performance issues when removing silicon oxide, such as from substrate surfaces, and may undesirably remove liner and/or spacer materials.

The present technology overcomes these issues by developing selective etching processes for removal or cleaning. By utilizing selective etching processes performed in particular equipment, the processes described may overcome issues associated with conventional technologies by performing a dry etch process that may limit bombardment to surfaces, while performing a reaction that can facilitate removal of target materials. Additionally, the materials and conditions used may allow improved material removal relative to conventional techniques.

Although the remaining disclosure will routinely identify specific etching processes utilizing the disclosed technology, it will be readily understood that the systems and methods are equally applicable to a variety of other etching and cleaning processes as may occur in the described chambers. Accordingly, the technology should not be considered to be so limited as for use with the described etching processes alone. The disclosure will discuss one possible system and chambers that can be used with the present technology to perform certain of the removal operations before describing operations of an exemplary process sequence according to the present technology.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes and selective deposition described herein in addition to cyclical layer deposition (CLD), atomic layer deposition (ALD), chemical vapor deposition (CVD), physical vapor deposition (PVD), wet etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material or metal-containing material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments.

In some embodiments the chambers specifically include at least one etching chamber as well as at least one deposition chamber. By including these chambers in combination on the processing side of the factory interface, all etching and deposition processes discussed below may be performed in a controlled environment. For example, a vacuum environment may be maintained on the processing side of holding area 106, so that all chambers and transfers are maintained under vacuum in embodiments. This may also limit water vapor and other air components from contacting the substrates being processed. It will be appreciated that additional configurations of deposition, etching, annealing, and curing chambers for dielectric films are contemplated by system 100.

Figure 2A:
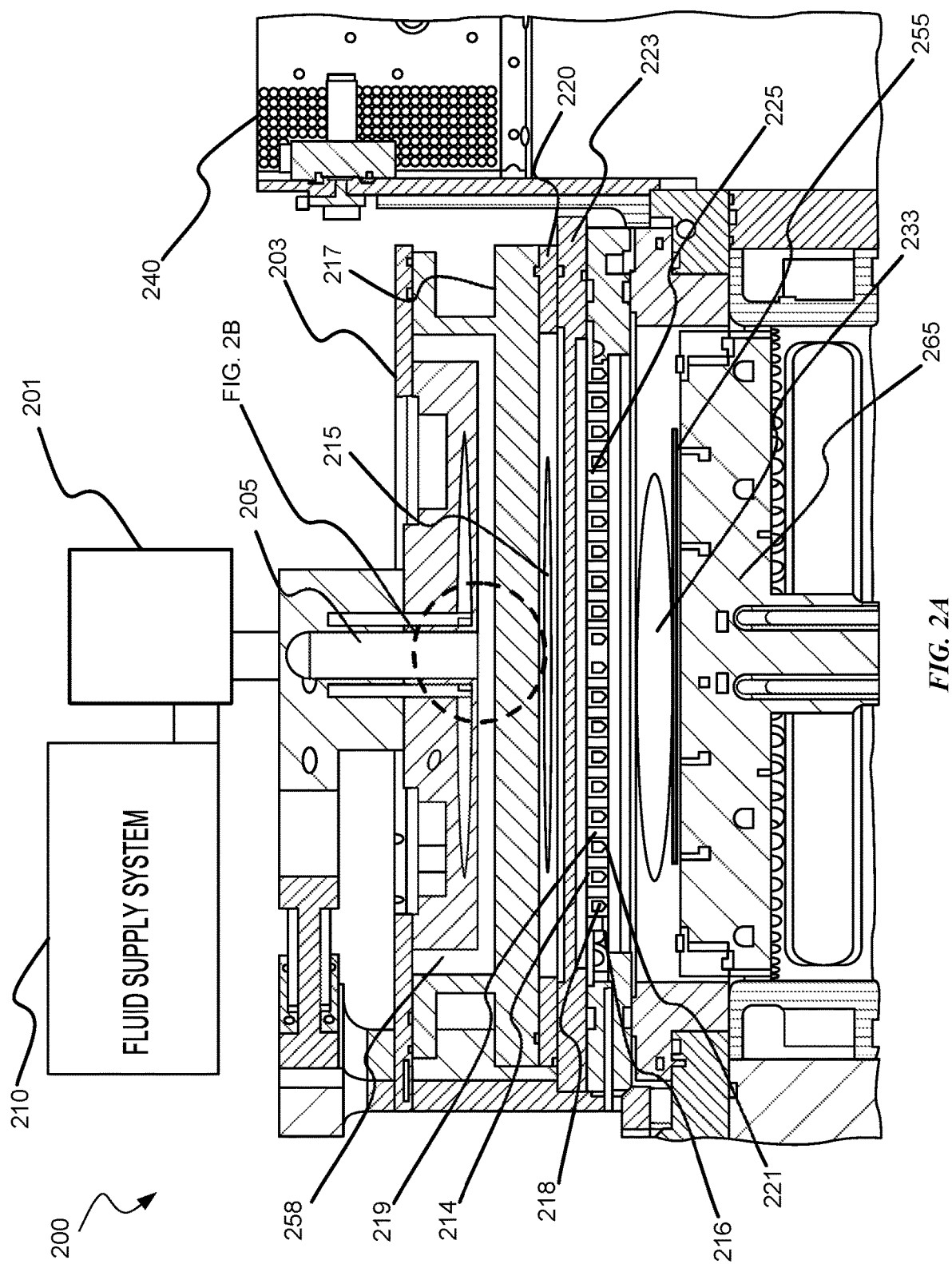
FIG. 2A shows a schematic cross-sectional view of an exemplary processing chamber according to embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, cobalt, aluminum oxide, tungsten oxide, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a pedestal 265, having a substrate 255 disposed thereon, are shown and may each be included according to embodiments. The pedestal 265 or substrate support may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases.

Figure 2B:
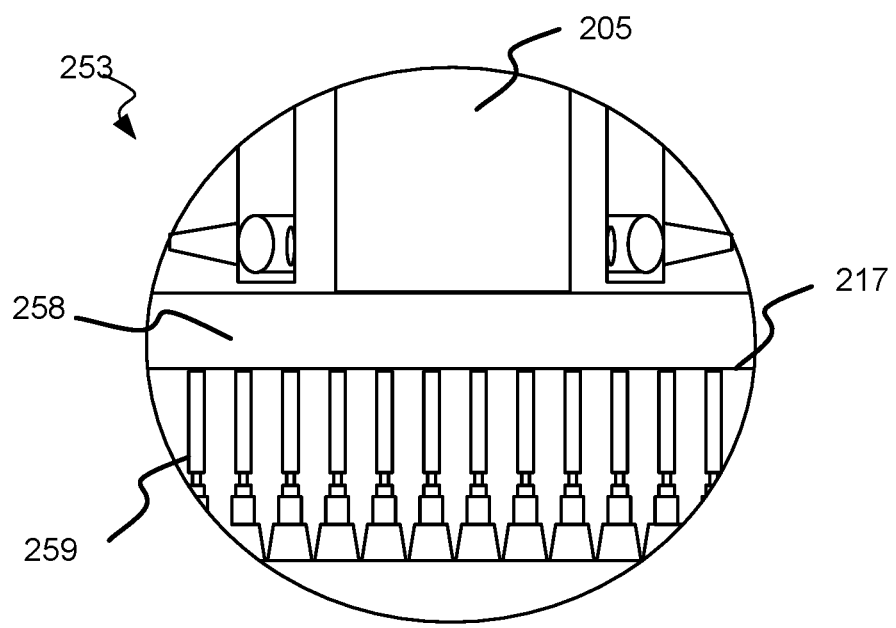
FIG. 2B shows a detailed view of an exemplary showerhead according to embodiments of the present technology.

Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. In embodiments, the plasma formed in substrate processing region 233 may be a DC biased plasma formed with the pedestal acting as an electrode. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

The gas distribution assemblies such as showerhead 225 for use in the processing chamber section 200 may be referred to as dual channel showerheads (DCSH) and are additionally detailed in the embodiments described in FIG. 2B. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the showerhead 225.

Figure 3:
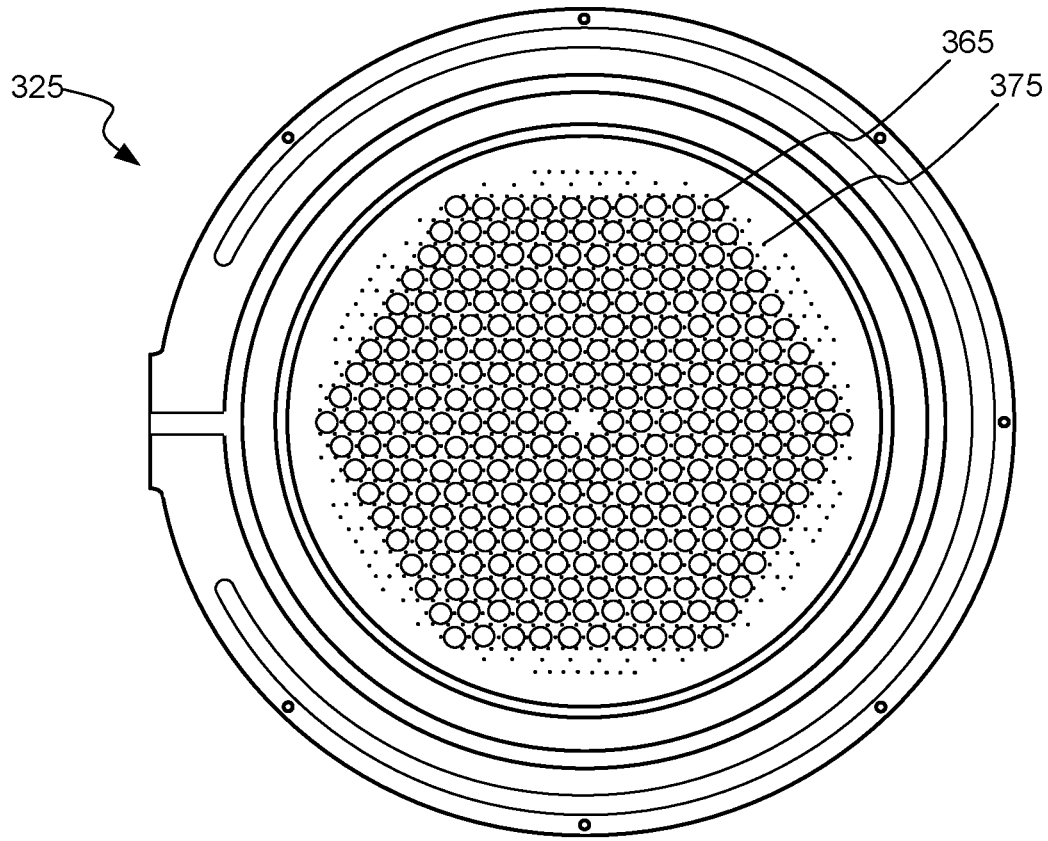
FIG. 3 shows a bottom plan view of an exemplary showerhead according to embodiments of the present technology.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
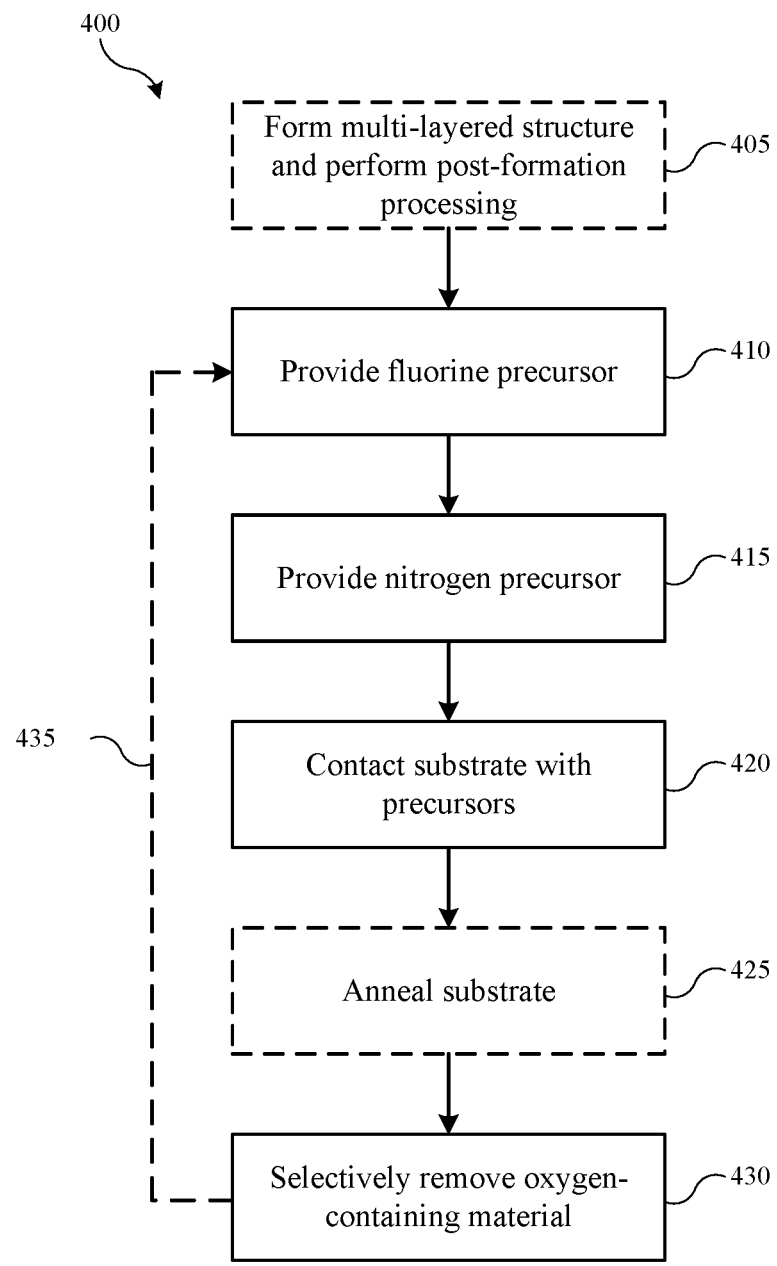
FIG. 4 shows selected operations in a method of forming a semiconductor structure according to embodiments of the present technology.
Figure 5A:
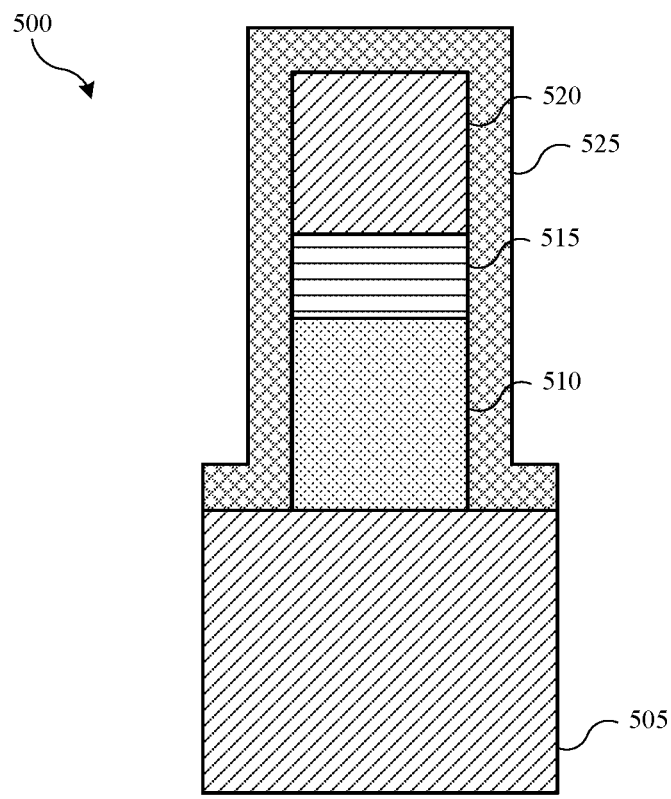
FIGS. 5A-5C show schematic cross-sectional views of exemplary substrates according to embodiments of the present technology.
Figure 5B:
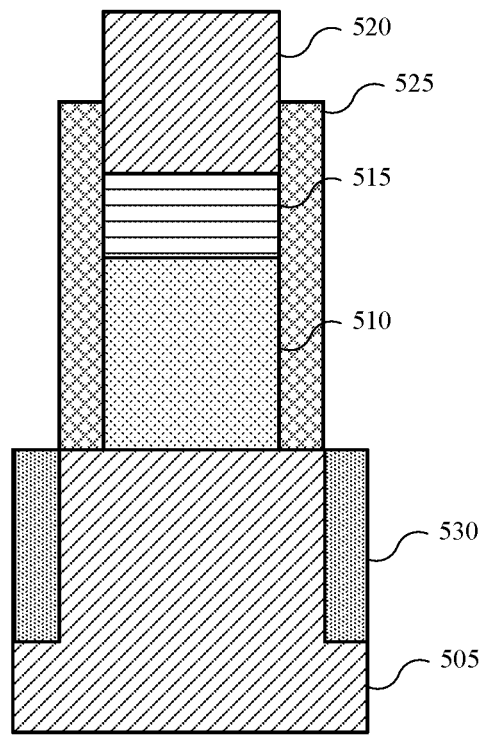
Figure 5C:
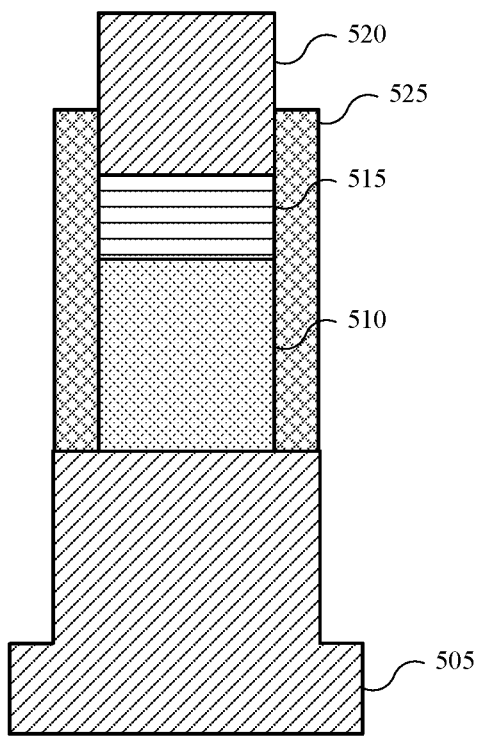

FIG. 4 illustrates a method 400 of forming a semiconductor structure, many operations of which may be performed, for example, in the chamber 200 as previously described. Method 400 may include one or more operations prior to the initiation of the method, including front end processing, polishing, cleaning, deposition, etching, or any other operations that may be performed prior to the described operations. The method may include a number of optional operations as denoted in the figure, which may or may not be specifically associated with the method according to the present technology. For example, many of the operations are described in order to provide a broader scope of the structural formation, but are not critical to the technology, or may be performed by alternative methodology as will be discussed further below. Method 400 describes the operations shown schematically in FIGS. 5A-5C, the illustrations of which will be described in conjunction with the operations of method 400. It is to be understood that FIGS. 5A-5C illustrate only partial schematic views, and a substrate may contain any number of transistor sections having aspects as illustrated in the figures. The operations of method 400 may be performed to form a bottom insulation layer to prevent current leakage through a bottom nanowire channel. The operations of method 400 may also be performed to limit or eliminate RIE and/or ion implantation processes, and to prevent damage to silicon-containing surfaces for defect-less source or drain formation. The operations of method 400 may be further performed to limit or eliminate masking operations and/or RIE processes, and to reduce process queue times.

As illustrated in FIG. 5A, method 400 may begin at optional operation 405 by forming a multi-layered structure over a substrate 505 and by performing post-treatment processing of the structure 500. The substrate 505 may be made of or contain silicon or some other semiconductor substrate material. The multi-layered structure may include layers of different silicon-containing materials. The multi-layered structure may include a polysilicon material 510. The polysilicon material 510 may be formed on the substrate 505. A silicon nitride material 515 may be formed over the polysilicon material 510. An oxide material 520 may be formed over the silicon nitride material 515. The oxide material 520 may include, for example, silicon oxide or any other oxide material. A liner material 525, or spacer material, may be formed over the substrate 505, the polysilicon material 510, the silicon nitride material 515, and the oxide material 520. The liner material 525 may be, for example, a silicon-and-nitrogen-containing material. In embodiments, the liner material may be silicon nitride. In other embodiments, the liner material 525 may be a low dielectric constant material, such as silicon oxynitride (SiON) or silicon oxycarbonitride (SiOCN). As will be discussed in more detail below, the multi-layered structure may be subsequently developed into various transistor structures.

Also at optional operation 405, post-formation processing may be performed on the structure 500. As previously discussed, front end processing, polishing, cleaning, deposition, etching, or any other operations that may be performed. As shown in FIG. 5B, for example, an etching operation, such as a reactive ion etching operation, may be performed to form recesses in the substrate 505. The reactive ion etching operation, which may utilize an oxygen-containing precursor, may form silicon-and-oxygen-containing material 530 on the substrate 505. In embodiments, the silicon-and-oxygen-containing material 530 may be an oxidized surface of the substrate 505. The reactive ion etching operation may also remove a portion of the liner material 525, such as the liner material 525 overlying the substrate 505. The reactive ion etching operation may also damage or remove a portion of the liner material 525 overlying the oxide material 520.

At operation 410, method 400 may include providing a fluorine-containing precursor to a processing region of the semiconductor processing chamber, such as chamber 200 as previously described. At operation 410 and as shown in FIG. 5B, the substrate 505 may include an exposed region of silicon-and-oxygen-containing material 530 and an exposed region of a liner material 525. An exemplary fluorine-containing precursor may be hydrogen fluoride (HF). Other sources of fluorine can be used in combination with hydrogen fluoride or as a substitute for hydrogen fluoride. In some embodiments, the fluorine-containing precursor may be or include atomic fluorine, diatomic fluorine, hydrogen fluoride, nitrogen trifluoride, carbon tetrafluoride, xenon difluoride, and various other fluorine-containing precursors used or available in semiconductor processing.

A flow rate of the fluorine-containing precursor may be less than or about 500 sccm, and may be less than or about 450 sccm, less than or about 400 sccm, less than or about 350 sccm, less than or about 300 sccm, less than or about 250 sccm, less than or about 200 sccm, less than or about 150 sccm, less than or about 100 sccm, less than or about 75 sccm, less than or about 50 sccm, or less.

At operation 415, method 400 may include providing a hydrogen-containing precursor to a processing region of the semiconductor processing chamber. They hydrogen-containing precursor may also include nitrogen. Accordingly, the hydrogen-containing precursor may include an amine group. An amine group is defined as having a nitrogen possessing a lone pair of electrons (denoted canonically N:). For example, the hydrogen-containing precursor may be or include ammonia, methyl amine, ethylamine, diethylamine, methyl ethyl diamine, and various other hydrogen-containing precursors used or available in semiconductor processing.

A flow rate of the hydrogen-containing precursor may be less than or about 100 sccm, and may be less than or about 90 sccm, less than or about 80 sccm, less than or about 70 sccm, less than or about 60 sccm, less than or about 50 sccm, less than or about 40 sccm, less than or about 30 sccm, less than or about 20 sccm, less than or about 15 sccm, less than or about 10 sccm, or less. The flow rates of the fluorine-containing precursor and the hydrogen-containing precursor may be low enough to minimize etching or removal of other materials in the structure 500, while etching and/or forming byproducts to be sublimated in the exposed region of silicon-and-oxygen-containing material 530.

As previously discussed, a flow rate of the fluorine-containing precursor may be, for example, less than or about 500 sccm and a flow rate of the hydrogen-containing precursor may be, for example, less than or about 100 sccm. A flow rate ratio of ratio of the fluorine-containing precursor relative to the hydrogen-containing precursor is less than or about 10:1. At flow rate ratios greater than or about 10:1, the partial pressure of the fluorine-containing material may increase to a point that causes selectivity in the removal of silicon-and-oxygen-containing material to decrease. Accordingly, the flow rate ratio of ratio of the fluorine-containing precursor relative to the hydrogen-containing precursor may be less than or about 9:1, less than or about 8:1, less than or about 7:1, less than or about 6:1, less than or about 5:1, less than or about 4:1, less than or about 3:1, less than or about 2:1, or less. However, an increased flow rate of the fluorine-containing precursor relative to the hydrogen-containing precursor may increase the etch rate of silicon-and-oxygen-containing materials. Accordingly, the flow rate ratio of ratio of the fluorine-containing precursor relative to the hydrogen-containing precursor may be greater than or about 2:1, greater than or about 3:1, greater than or about 4:1, greater than or about 5:1, or higher.

The fluorine-containing precursor and the hydrogen-containing precursor may be provided to the processing region separately or, in embodiments, may be mixed or combined prior to being provided to the processing region. The fluorine-containing precursor and the hydrogen-containing precursor may also be provided with any number of carrier gases, which may include nitrogen, helium, argon, or other inert gases.

At operation 420, method 400 may include contacting the substrate 505, and the multi-layered structure, with the fluorine-containing precursor and the hydrogen-containing precursor. By contacting the substrate 505 with the fluorine-containing precursor and the hydrogen-containing precursor a byproduct may be formed from the exposed region of silicon-and-oxygen-containing material 530 on the substrate 505. The fluorine-containing precursor and the hydrogen-containing precursor may interact with the exposed region of silicon-and-oxygen-containing material 530 on the substrate 505 to form solid byproducts, which may include ammonium fluorosilicate (($NH_4$)$_2$$SiF_6$). Gaseous byproducts, which may include silicon tetrafluoride ($SiF_4$) and hydrogen, such as diatomic hydrogen ($H_2$), may also be formed, which may outgas. As discussed below, the solid byproducts, such as ammonium fluorosilicate (($NH_4$)$_2$$SiF_6$), may be removed, such as through sublimation.

Process conditions may impact the operations performed in method 400. Each of the operations of method 400 may be performed during a constant temperature in embodiments, while in some embodiments the temperature may be adjusted during different operations. In some embodiments of the present technology, method 400 may be performed at substrate, pedestal, and/or chamber temperatures less or about 200° C., and may be performed at temperatures less than or about 180° C., less than or about 160° C., less than or about 140° C., less than or about 120° C., less than or about 100° C., less or about 80° C., less or about 60° C., less or about 40° C., less or about 30° C., less or about 20° C., less or about 15° C., less or about 10° C., or lower. The temperature may also be maintained at any temperature within these ranges, within smaller ranges encompassed by these ranges, or between any of these ranges.

The pressure within the semiconductor processing chamber may also affect the operations performed. Accordingly, in some embodiments the pressure may be maintained at less than about 20 Torr, less than or about 15 Torr, less than or about 10 Torr, less than or about 9 Torr, less than or about 8 Torr, less than or about 7 Torr, less than or about 6 Torr, less than or about 5 Torr, less than or about 4 Torr, less than or about 3 Torr, less than or about 2 Torr, less than or about 1 Torr, less than or about 0.8 Torr, less than or about 0.6 Torr, less than or about 0.4 Torr, less than or about 0.2 Torr, or less. The pressure may also be maintained at any pressure within these ranges, within smaller ranges encompassed by these ranges, or between any of these ranges. Adding further control to the process, the partial pressure of fluorine-containing precursor may be adjusted to adjust selectivity. For example, as partial pressure of the fluorine-containing precursor increases selectivity of the removal of silicon-and-oxygen-containing material 530 may decrease. Accordingly, the partial pressure of the fluorine-containing precursor may be maintained at less than or about 0.05 Torr to maintain the selectivity of the removal of silicon-and-oxygen-containing material 530. For example, the partial pressure of the fluorine-containing precursor may be maintained at less than or about 0.045 Torr, less than or about 0.04 Torr, less than or about 0.035 Torr, less than or about 0.03 Torr, less than or about 0.025 Torr, less than or about 0.02 Torr, less than or about 0.015 Torr, less than or about 0.01 Torr, or less.

In embodiments, method 400 may be a purely thermal operation. In such embodiments, the processing region is maintained plasma-free during the method 400. It is also contemplated that a plasma may be formed from the fluorine-containing precursor and/or the hydrogen-containing precursor. The plasma of either or both precursors may be formed in the processing region of the semiconductor processing chamber or, alternatively, may be formed in a remote plasma system. However, the present technology, unlike conventional technologies, may not require the formation of plasma to effectively remove exposed silicon-and-oxygen-containing materials selective to other materials described herein.

At optional operation 425, method 400 may include performing a thermal anneal after contacting the substrate 505 with the fluorine-containing precursor and the hydrogen-containing precursor. The thermal anneal may selectively remove the portion of the exposed silicon-and-oxygen-containing material through sublimation, such as the byproduct formed while contacting the substrate 505, and the silicon-and-oxygen-containing material 530, with the fluorine-containing precursor and the hydrogen-containing precursor. During the operation 425, the substrate 505 may be lifted, such as with lift pins in the substrate support, to be positioned closer to the showerhead of the semiconductor processing chamber. The showerhead may be at a higher temperature than the substrate support, thereby increasing a temperature of the substrate during operation 425. Operation 425 may increase a temperature of the substrate to greater than or about 80° C., greater than or about 90° C., greater than or about 100° C., greater than or about 110° C., greater than or about 120° C., greater than or about 130° C., greater than or about 140° C., greater than or about 150° C., or higher. During operation 425, one or more inert gases may be provided to the processing chamber to facilitate the sublimation of byproduct. For example, one or more of hydrogen, such as diatomic hydrogen, argon, neon, or xenon may be provided during operation 425.

As shown in FIG. 5C, at operation 430, method 400 may include selectively removing at least a portion of the exposed silicon-and-oxygen-containing material 530. A removal rate of the exposed region of silicon-and-oxygen-containing material 530 may be greater than or about 0.3 Å/second, and may be greater than or about 0.4 Å/second, greater than or about 0.5 Å/second, and may be greater than or about 0.6 Å/second, greater than or about 0.7 Å/second, and may be greater than or about 0.8 Å/second, greater than or about 0.9 Å/second, and may be greater than or about 1.0 Å/second, or higher. However, to maintain high selectivity, the flow rate of the fluorine-containing precursor and/or the hydrogen-containing precursor may be provided to maintain the removal rate of the exposed region of silicon-and-oxygen-containing material 530 at less than or about 1.5 Å/second, such as less than or about 1.3 Å/second or less than or about 1.0 Å/second.

At optional operation 435, method 400 may include repeating operations 410-430 for one or more additional cycles. Operations 410-430 may define a cycle of method 400. At removal times longer than or about 200 seconds, selectivity may begin to decrease due to the prolonged contact between the precursors and the liner material 525. Accordingly, each cycle may be less than or about 200 seconds, less than or about 190 seconds, less than or about 180 seconds, less than or about 170 seconds, less than or about 160 seconds, less than or about 150 seconds, less than or about 140 seconds, less than or about 130 seconds, less than or about 120 seconds, less than or about 110 seconds, less than or about 100 seconds, less than or about 90 seconds, less than or about 80 seconds, less than or about 70 seconds, less than or about 60 seconds, less than or about 50 seconds, less than or about 40 seconds, less than or about 30 seconds, less than or about 20 seconds, less than or about 10 seconds, or less. In order to remove the desired amount of exposed silicon-and-oxygen-containing material 530, operations 410-430 may be repeated at least two times, at least three times, at least four times, at least five times, at least six times, or more. The cyclic etch and byproduct sublimation process may suppress etching or removal of the liner material 525 and allow for highly selective etching or removal of the silicon-and-oxygen-containing material 530.

By performing operations according to embodiments of the present technology, silicon-and-oxygen-containing materials may be etched selectively relative to other materials, including any of the materials previously described. For example, the present technology may selectively etch silicon-and-oxygen-containing materials relative to exposed regions of low dielectric constant materials, including SiON, SiOCN, or other dielectrics and/or silicon nitride as previously noted. Embodiments of the present technology may etch silicon-and-oxygen-containing materials relative to low dielectric constant materials at a rate of at least about 1.5:1, and may etch silicon-and-oxygen-containing materials relative to exposed low dielectric constant materials at a selectivity greater than or about 2.0:1, greater than or about 2.5:1, greater than or about 3.0:1, greater than or about 3.5:1, greater than or about 4.0:1, greater than or about 4.5:1, greater than or about 5.0:1, or more. Embodiments of the present technology may etch silicon-and-oxygen-containing materials relative to silicon nitride at a rate of at least about 30:1, and may etch silicon-and-oxygen-containing materials relative to exposed silicon nitride at a selectivity greater than or about 35:1, greater than or about 40:1, greater than or about 45:1, greater than or about 50:1, greater than or about 55:1, greater than or about 60:1, or more. For example, etching performed according to some embodiments of the present technology may etch silicon-and-oxygen-containing materials while substantially or essentially maintaining any of the other silicon-containing materials described above.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a material" includes a plurality of such materials, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing a fluorine-containing precursor to a processing region of a semiconductor processing chamber, wherein a substrate is disposed within the processing region, wherein the substrate comprises an exposed region of silicon-and-oxygen-containing material, wherein the exposed region of silicon-and-oxygen-containing material is an oxidized surface of the substrate, and wherein the substrate comprises an exposed region of a liner material;
providing a hydrogen-containing precursor to the semiconductor processing region;
contacting the substrate with the fluorine-containing precursor and the hydrogen-containing precursor; and
selectively removing at least a portion of the exposed region of silicon-and-oxygen-containing material.

2. The semiconductor processing method of claim 1, wherein the fluorine-containing precursor comprises hydrogen fluoride.

3. The semiconductor processing method of claim 1, wherein the hydrogen-containing precursor comprises ammonia.

4. The semiconductor processing method of claim 1, wherein the exposed region of the liner material comprises a low dielectric constant spacer material.

5. The semiconductor processing method of claim 1, wherein a temperature within the semiconductor processing chamber is maintained at less than or about 200° C.

6. The semiconductor processing method of claim 1, wherein a pressure within the semiconductor processing chamber is maintained at less than or about 20 Torr.

7. The semiconductor processing method of claim 1, further comprising:
performing a thermal anneal subsequent to contacting the substrate with the fluorine-containing precursor and the hydrogen-containing precursor, wherein the thermal anneal selectively removes the portion of the exposed region of silicon-and-oxygen-containing material through sublimation.

8. A semiconductor processing method comprising:
i) providing a fluorine-containing precursor and a hydrogen-containing precursor to a processing region of a semiconductor processing chamber, wherein a substrate comprising an exposed region of silicon-and-oxygen-containing material and an exposed region of a liner material is disposed within the processing region;
ii) contacting the exposed region of silicon-and-oxygen-containing material with the fluorine-containing precursor and the hydrogen-containing precursor;
iii) forming a silicon-and-oxygen-containing byproduct on the substrate; and
iv) annealing the substrate, wherein the annealing sublimates at least a portion of the silicon-and-oxygen-containing byproduct.

9. The semiconductor processing method of claim 8, wherein operations i) through iv) comprise a cycle, and wherein the semiconductor processing method comprises at least two cycles.

10. The semiconductor processing method of claim 9, wherein each cycle is performed for less than or about 200 seconds.

11. The semiconductor processing method of claim 8, wherein the portion of the silicon-and-oxygen-containing byproduct is removed at a selectivity of greater than or about 3:1 relative to the exposed region of the liner material.

12. The semiconductor processing method of claim 8, wherein a flow rate of the fluorine-containing precursor is less than or about 500 sccm.

13. The semiconductor processing method of claim 8, wherein a flow rate of the hydrogen-containing precursor is less than or about 100 sccm.

14. A semiconductor processing method comprising:
providing a fluorine-containing precursor to a processing region of a semiconductor processing chamber, wherein a substrate is disposed within the processing region, wherein the substrate comprises an exposed region of silicon-and-oxygen-containing material, and wherein the substrate comprises an exposed region of a liner material;
providing a hydrogen-containing precursor to the semiconductor processing region;
contacting the substrate with the fluorine-containing precursor and the hydrogen-containing precursor; and
annealing the substrate, wherein annealing the substrate sublimates at least a portion of the exposed region of silicon-and-oxygen-containing material relative to the exposed region of the liner material.

15. The semiconductor processing method of claim 14, wherein annealing the substrate comprises positioning the substrate closer to a showerhead of the semiconductor processing chamber.

16. The semiconductor processing method of claim 14, wherein a selectivity between the exposed region of silicon-and-oxygen-containing material relative to the exposed region of the liner material is greater than or about 3:1.

17. The semiconductor processing method of claim 14, wherein a flow rate ratio of the fluorine-containing precursor relative to the hydrogen-containing precursor is less than or about 10:1.

18. The semiconductor processing method of claim 14, wherein a removal rate of the exposed region of silicon-and-oxygen-containing material is greater than or about 0.3 Å/second.

19. The semiconductor processing method of claim 14, wherein the processing region is maintained plasma-free during the semiconductor processing method.

20. The semiconductor processing method of claim 8, wherein the exposed region of silicon-and-oxygen-containing material is an oxidized surface of the substrate.

* * * * *